US008689163B2

(12) United States Patent
Kim et al.

(10) Patent No.: US 8,689,163 B2
(45) Date of Patent: Apr. 1, 2014

(54) SEMICONDUCTOR APPARATUS CAPABLE OF ERROR REVISION USING PIN EXTENSION TECHNIQUE AND DESIGN METHOD THEREFOR

(75) Inventors: Dong-Yun Kim, Yongin-si (KR); Dong-Hoon Yeo, Ansan-si (KR); Hyun-Chul Shin, Ansan-si (KR); Kyung-Ho Kim, Seongnam-si (KR); Byung-Tae Kang, Seoul (KR); Ju-Yong Shin, Ansan-si (KR); Sung-Chul Lee, Ansan-si (KR)

(73) Assignees: Samsung Electronics Co., Ltd., Suwon-si (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 135 days.

(21) Appl. No.: 12/928,021

(22) Filed: Dec. 1, 2010

(65) Prior Publication Data

US 2011/0140280 A1 Jun. 16, 2011

(30) Foreign Application Priority Data

Dec. 11, 2009 (KR) .................. 10-2009-0122917

(51) Int. Cl.
*G06F 17/50* (2006.01)

(52) U.S. Cl.
USPC ............. 716/119; 716/55; 716/112; 716/139; 438/598; 438/599; 438/600; 438/601

(58) Field of Classification Search
USPC .............. 716/112, 119, 139, 50–56; 438/598, 438/599, 600, 601
See application file for complete search history.

(56) References Cited

U.S. PATENT DOCUMENTS

| 6,404,226 B1 * | 6/2002 | Schadt ............................ 326/41 |
| 6,791,355 B2 | 9/2004 | Vergnes |
| 2004/0221249 A1 * | 11/2004 | Lahner et al. ..................... 716/4 |
| 2005/0224950 A1 * | 10/2005 | Tsai .............................. 257/700 |
| 2008/0224321 A1 * | 9/2008 | Jinno ........................... 257/773 |

* cited by examiner

*Primary Examiner* — Nha Nguyen

(57) ABSTRACT

A semiconductor apparatus and a design method for the semiconductor apparatus allow debugging or repairs by using a spare cell. The semiconductor apparatus includes a plurality of metal layers. At least one repair block performs a predetermined function. A spare block is capable of substituting for a function of the repair block. And at least one of the plurality of metal layers is predetermined to be a repair layer for error revision. At least one pin of the repair block is connected to the repair layer through a first pin extension, and at least one pin of the spare block is capable of extending to the repair layer. When the repair block is to be repaired, the pin extension of the repair layer and the repair block is disconnected, and at least one pin of the spare block is connected to the repair layer through a second pin extension.

17 Claims, 5 Drawing Sheets

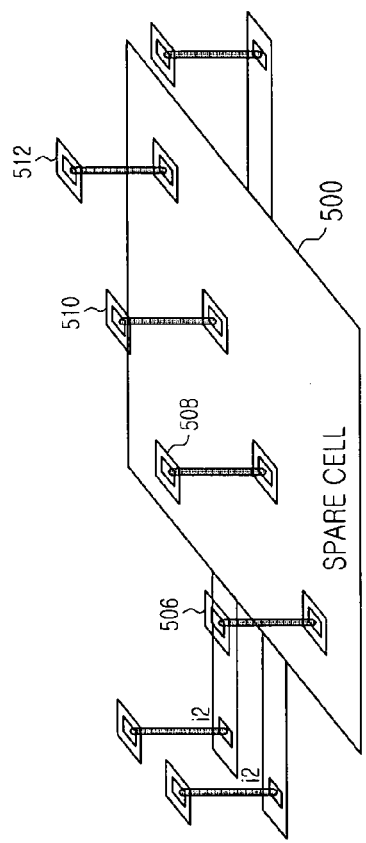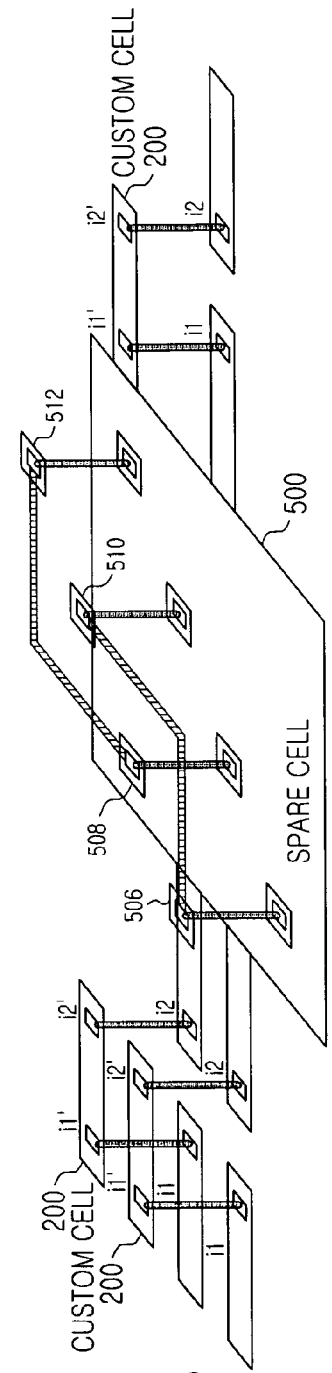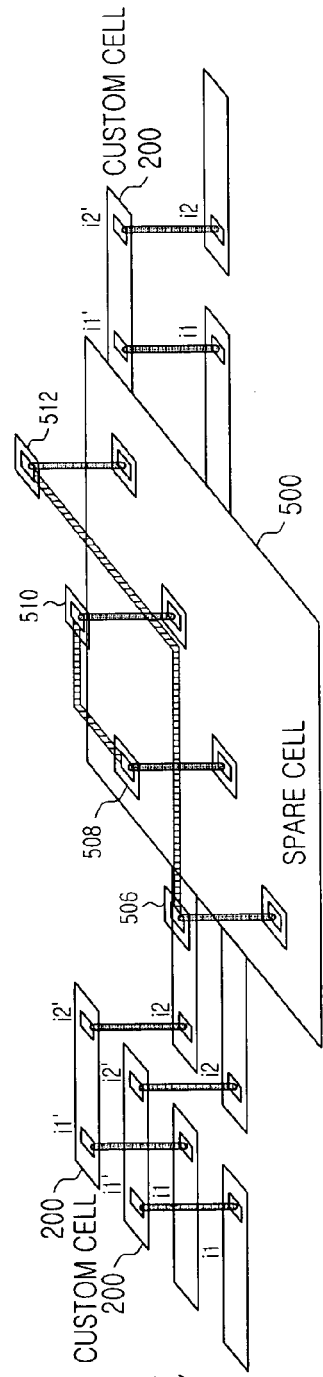
FIG.5A
FIG.5B
FIG.5C

SEMICONDUCTOR APPARATUS CAPABLE OF ERROR REVISION USING PIN EXTENSION TECHNIQUE AND DESIGN METHOD THEREFOR

CROSS-REFERENCE TO RELATED APPLICATION(S) AND CLAIM OF PRIORITY

The present application is related to and claims priority to application entitled "Semiconductor Apparatus Capable of Error Revision Using Pin Extension Technique and Design Method Therefor" filed with the Korean Intellectual Property Office on Dec. 11, 2009 and assigned Serial No. 10-2009-0122917, the contents of which are incorporated herein by reference.

TECHNICAL FIELD OF THE INVENTION

The present invention relates to a semiconductor apparatus and a design method and, more particularly, to a semiconductor apparatus and a design method in which a silicon chip can be debugged or repaired by using a spare cell.

BACKGROUND OF THE INVENTION

As semiconductor processing technology is highly developed, and a circuit gradually becomes more complicated, the possibility that an error occurs in a design process of a semiconductor also increases. When an error is found after the manufacture of a silicon chip, a mask has to be manufactured again. Thus, in an ultra-integrated process, a cost for error revision is increased, and much time for the error revision is required.

In general, a standard cell includes a plurality of lower metal layers. When an error occurs during the manufacture of a silicon chip, metal layer revision has to be carried out, and the process has to be carried out again from a lower metal layer. Thus, a fabrication time for obtaining a chip is delayed, and the number of masks required to be revised is increased. The delay of a fabrication time and the increase in the number of masks to be manufactured immediately result in an increase in the cost.

In general, when designing and manufacturing a semiconductor chip, a computer aided design (CAD) tool, (i.e., an electronic design automation (hereinafter, referred to as EDA) tool) is used. The EDA tool used in the design of a semiconductor chip can perform a layout process, or an equivalent, as well as a place & route (P&R) process. In the P&R process, a netlist indicating connection information between a cell or a block and a metal layer is configured.

A method for interconnection between a block to be repaired due to an error and a spare block includes a standard metal method and a programmable interconnection method.

The standard metal method is a technique of previously disposing a mesh-structured wire matrix, and revising and connecting a vertical interconnect access (via) on the wire matrix when a repair is required.

In the standard metal method, it is possible to revise a metal layer by correction of a via. However, the mesh-structured wire matrix has to be formed in proportion to the number of interconnections between blocks or cells, thereby drastically increasing routing overhead.

The programmable interconnection method is a technique of connecting a spare block and a block to be repaired by a switch block, in which the spare block is connected instead of the block that has an error so as to revise the error.

In the programmable interconnection method, a plurality of switch blocks are required, and also when the number of interconnections is changed, a programmable interconnection block is required to be generally changed. Also, in the programmable interconnection method, an area occupied by a programmable interconnection block for the revision of a metal layer is larger than a block for an original function. Accordingly, this method is inefficient because the power consumption and delay are highly increased due to the use of the programmable interconnection block.

SUMMARY OF THE INVENTION

To address the above-discussed deficiencies of the prior art, it is a primary object to provide a metal layer revision method, in which a semiconductor chip can be designed by a standard metal method that does not require a wire matrix with a complicated mesh structure, unlike a conventional technology. The standard metal method, according to embodiments of the present invention, shows a higher performance and requires a lower consumption of power, compared to a programmable interconnection method.

Also, the present invention provides a metal layer revision technology, in which interconnection between a spare block and a to-be-repaired block can be performed without revision of a lower metal layer, such that an error occurring after manufacturd of a semiconductor chip can be revised with a low cost within a short time.

Also, the present invention provides a method for substituting a pin extension of a to-be-repaired block by a pin extension of a spare block without application of additional constraints when an electronic design automation (EDA) tool is used for designing a silicon chip.

Also, the present invention provides a method for revising an error by changing only a portion of metal layers, rather than changing all of the metal layers, when the error occurs in a semiconductor chip under design or manufacture.

In accordance with an aspect of the present invention, there is provided a semiconductor apparatus that includes a plurality of metal layers. The semiconductor apparatus includes at least one repair block performing a predetermined function. A spare block is capable of substituting for the predetermined function of the repair block. And at least one repair layer is predetermined for error revision, from among the plurality of metal layers. At least one pin of the repair block is connected to the repair layer through first pin extension, and at least one pin of the spare block is capable of extending to the repair layer. And when the repair block is to be repaired, the first pin extension between the repair layer and the repair block is disconnected, and the at least one pin of the spare block is connected to the repair layer through a second pin extension.

In accordance with another aspect of the present invention, there is provided a method for designing a semiconductor apparatus that includes a plurality of metal layers. The method includes connecting at least one pin of a repair block that has a possibility of an error to at least one repair layer predetermined for error revision, from among the plurality of metal layers, through a first pin extension. At least one pin of a spare block capable of substituting for the repair block is configured to be extended to the repair layer. The first pin extension between the repair layer and the repair block is disconnected, and at least one pin of the spare block is connected to the repair layer through a second pin extension when the repair block is to be repaired.

In accordance with yet another aspect of the present invention, a semiconductor apparatus includes a repair block connected to a first block and a second block of the semiconductor apparatus. The repair block performs a predetermined function between the first block and the second block. A spare block is capable of substituting the repair block when the repair block is to be repaired. Among the metal layers of the semiconductor apparatus, a repair layer is designated for error revision. A portion of the repair layer connects the repair block to the first block and the second block. When an error occurs after manufacture of a semiconductor chip, one predetermined metal layer can be manufactured again, such that the error can be revised with a low cost within a short revision period.

When the suggested method for connecting a custom cell to a spare cell is employed, re-spin automation can be carried out by an EDA (Electronic Design Automation) tool. Thus, it is possible to eliminate the possibility of an error caused by manual operation of a designer and shorten the development time of the repair.

In a general EDA tool, input/output of a signal for repair can be pin-extended to a metal layer set for error revision without complicated manual operations or application of constraints.

When an error is found after the manufacture of the chip, it is easy to disconnect a cell or block that has an error and substitute a spare cell or a spare block for the disconnected cell (or block) through extended pins.

For logic function programming of a spare cell, some signal inputs/outputs of a spare cell can be connected to a predetermined repair layer through pin extension and can be variously connected during a repair process.

It is possible to carry out error revision by merely changing a netlist without a special function for repair of a general EDA tool.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 5A-5C illustrate an embodiment in which the pin extension is applied to a part of signal terminals of a spare cell so as to support a logic function of a spare cell according to an embodiment of the present invention.

DETAILED DESCRIPTION OF THE INVENTION

FIGS. 1A through 5C, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged semiconductor apparatus.

In the following description of the present invention, a detailed description of known functions and configurations incorporated herein is omitted to avoid making the subject matter of the present invention unclear. Terms described herein are determined in consideration of functions in this invention, and definition of the terms may vary according to a user's (or an operator's) intention or custom. Also, the definitions of the terms are determined based on the contents throughout the specifications.

FIGS. 1A-1D illustrate a semiconductor apparatus in which a metal layer is revised by connecting a spare block using pin extension.

Figure 1A:
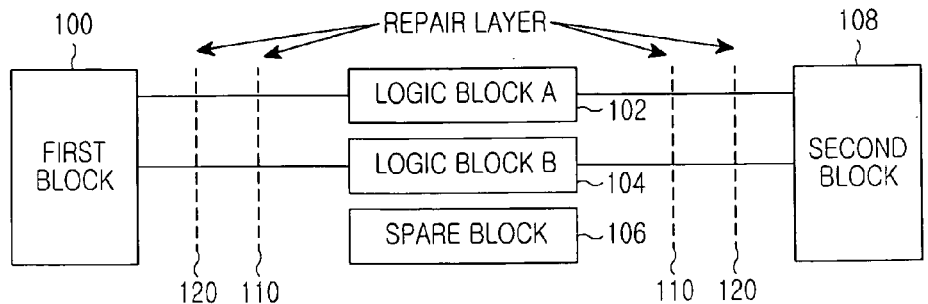
FIGS. 1A-1D illustrate a semiconductor apparatus in which a metal layer is revised by connecting a spare block using pin extension according to an embodiment of the present invention.
Figure 1B:
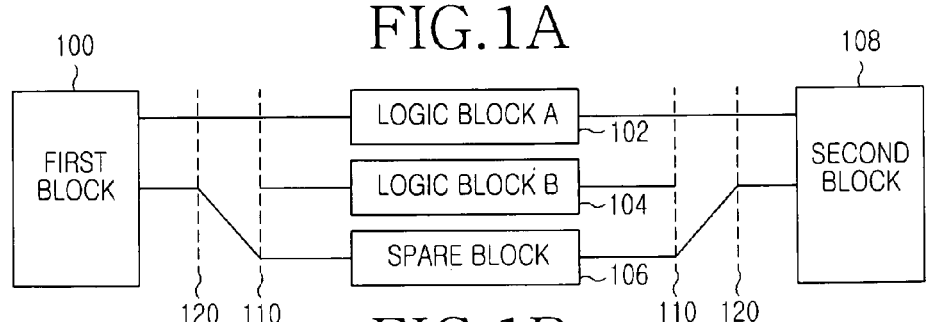
Figure 1C:
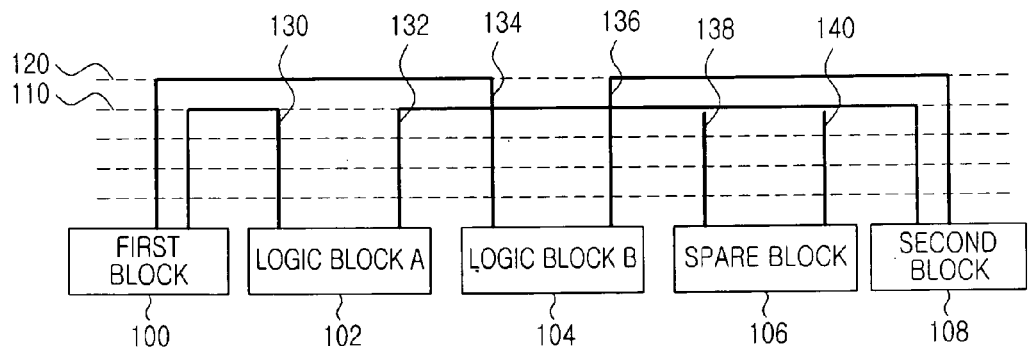
Figure 1D:
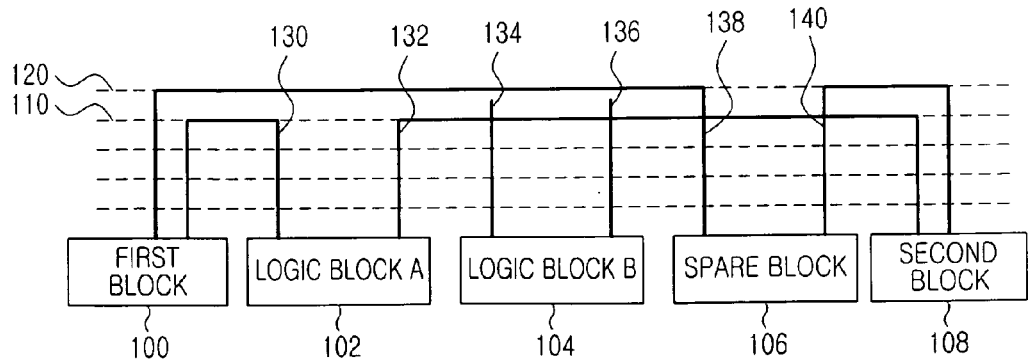
Figure 1E:
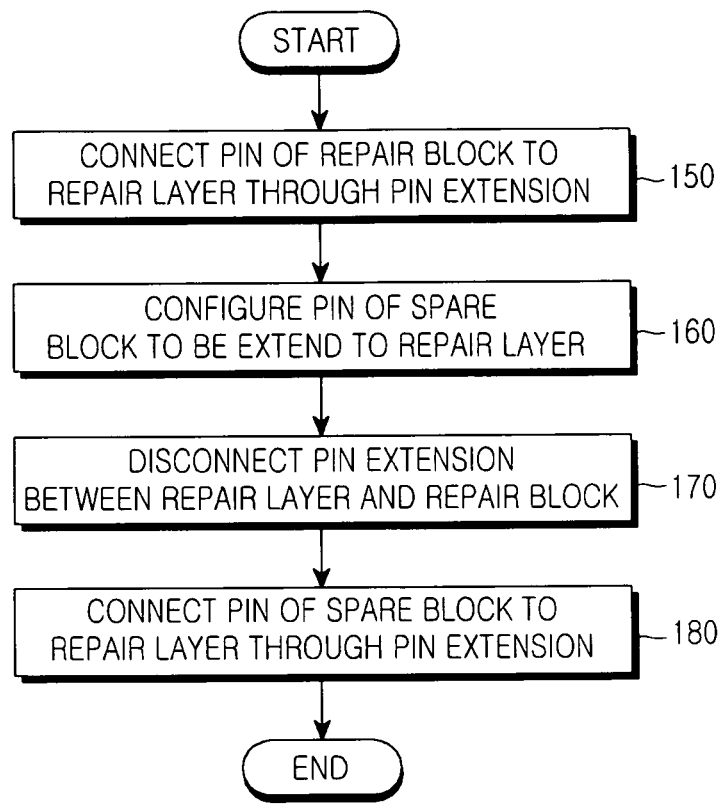
FIG. 1E illustrates a method for designing a semiconductor apparatus according to this disclosure.

FIG. 1E illustrates an interconnection between repair blocks, spare blocks, a first block, and a second block before repair of a metal layer, according to an embodiment of the present invention.

FIG. 1B illustrates an interconnection between repair blocks, spare blocks, a first block, and a second block after repair of a metal layer, according to an embodiment of the present invention.

Throughout the specifications, the terms, "cell" and "block", are used. The "cell" is a term used in a design process of a semiconductor chip, and also in a standard library, and indicates a basic unit of a circuit. The "block" indicates a unit including a one or more cells. Each cell or each block includes at least one terminal (or a metal wire) to/from which a signal can be input/output. Also, a "pin" is used as a term indicating a signal input/output terminal of a cell or a block, and "pin extension" indicates the extension of the input/output terminal.

A repair block indicates a block to be repaired. Also, a spare block indicates a block substituting for a block to be substituted due to an error (that is, a repair block), or a reserve block.

The revision of an error is carried out by disconnecting a block to be repaired (in other words, a block that has an error) from a first block and a second block, and connecting the disconnected first and, second blocks to a spare block substituting for the repair block.

According to FIGS. 1A-1D, when an error exists in logic block B 104 (repair block 104) from among a plurality of logic blocks 102, 104, and 106 performing a predetermined function between a first block 100 and a second block 108, the logic block B 104 that has been connected to the first block 100 and the second block 108 before repair, is disconnected from the first block 100 and the second block 108 while the repair is carried out. A spare block 106 for substituting for the logic block B 104 is connected to the first block 100 and the second block 108.

In order to make it easy to disconnect the repair block 104 from the first block 100 and the second block 108 and to connect the spare block 106 to the first block 100 and the second block 108, the connection of logic blocks 102, 104, and 106 that has a possibility of an error to the first and second blocks 100 and 108 is done through repair layers 110 and 120 as an additional metal layer. This makes it possible to revise the error by correcting only portions 110 and 120 of repair layers, and only a metal layer corresponding to the repair layers 110 and 120 is manufactured again. Thus, it is possible to revise the error within a short revision period.

In FIGS. 1A-1D, as an example, the two layers 110 and 120 are set as repair layers and are used for error revision. However, only one repair layer may be used for repair. Also, it is natural that one or more repair layers can be used. Herein, the repair layer is preferably assigned as an uppermost metal layer from among a plurality of metal layers constituting a semiconductor chip. This is because a change of the uppermost metal layer is easier than a change of a metal layer positioned in the middle position, for the revision.

A process of repairing an error by using a portion of repair layers is described with reference to FIGS. 1C and 1D as side views.

FIG. 1C illustrates a side view of an interconnection between repair blocks, spare blocks, a first block, and a second block before repair of a metal layer.

FIG. 1D illustrates a side view of the interconnection between repair blocks, spare blocks, a first block, and a second block after repair of a metal layer.

Before the repair, pins 130, 132, 134, and 136 of the logic blocks 102 and 104 that have a possibility of an error are extended to the two metal layers 110 and 120 which are assigned as the repair layers. Pins 138 and 140 of the spare block 106 capable of substituting for the logic blocks 102 and 104 are formed on the repair layer 110 or 120, and may be connected to another block through the repair layer 110 or 120. In other words, the pins 138 and 140 of the spare block 106 are configured to be extended to the repair layer 110 or 120.

During the repair process, the connections of a repair block to the first and second blocks are disconnected in the repair layer, and a spare block is connected to the first and second blocks in the repair layer. Thus, it is possible to revise an error by correcting a part of the metal layers. As illustrated in FIGS. 1C and 1D, when a repair has to be performed due to an error in the logic block B 104, the pins 134 and 136 of the logic block B 104 are disconnected from the repair layer 120, and the pins 138 and 140 of the spare block 106 are connected to the repair layer 120, so as to connect the spare block 106 to the first and second blocks 100 and 108.

As described above, the connection of the logic blocks 102 and 104, before repair, to the repair layers 110 and 120 may be carried out by pin extension. Also, in the repair process, the connection of the spare block 106 to the repair layer 120 is also carried out by pin extension.

Meanwhile, in FIG. 1C, before repair, the pins 138 and 140 of the spare block 106 are not connected to any metal layers. Also, in FIG. 1D, the disconnected pins of the logic block B 104 (pins 134 and 136) are not connected to any metal layers after the repair. As described above, pins not connected to any metal layer are considered as floated inputs in a place and route (hereinafter, referred to as P&R) process of an EDA tool, and thus may be deleted in an optimization process or recognized as errors.

Pins which are not connected to any metal layer, or disconnected from a certain metal layer, may be connected to a Vdd (power supply terminal) or a Vss (ground point) so as to avoid floating in the P&R process. Optionally, the pins connected to the Vdd or the Vss are extended to the height of a repair layer, and connected to the Vdd or the Vss without connecting to the repair layer.

Hereinafter, a method for supporting pin extension using a general EDA tool used for the design of a semiconductor chip will be described.

FIG. 1E illustrates a method for designing a semiconductor apparatus according to this disclosure. At step 150, connect pin of repair block to repair layer through pin extension. At step 160, configure pin of spare block to be extend to repair layer. At step 170, disconnect pin extension between repair layer and repair block. At step 180, connect pin of spare block to repair layer through pin extension.

If additional constraints are not applied to the pins extended for pin extension as described above, the extended pins are removed by an optimization function of an EDA tool (specifically, a P&R tool) during a layout process of the EDA tool, thereby preventing error revision from being performed. Accordingly, in order to use pin extension, the function of a general EDA tool (specifically, a P&R tool) has to be improved.

In order to use pin extension without improvement of the function of the EDA tool, a custom cell is provided. In other words, the use of a custom cell makes it possible for a designer to freely adjust the connection of a spare block for error revision using pin extension without improvement of a function of the P&R tool.

Figure 2:
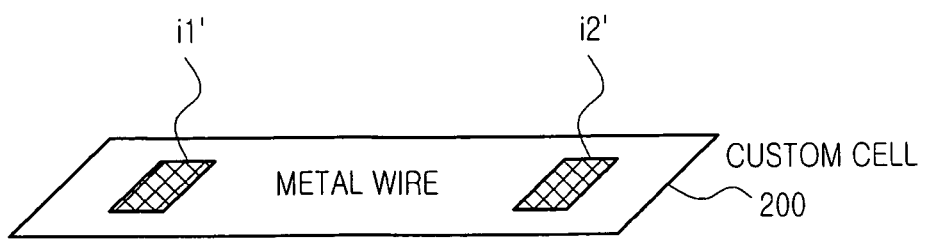
FIG. 2 illustrates a custom cell according to an embodiment of the present invention.

FIG. 2 illustrates a custom cell.

A custom cell 200 is a metal wire, and has at least one contact i1' and i2', as a spot to which a pin of a repair block or a spare block can be connected through extension. In other words, the custom cell indicates a metal wire that allows interconnection between blocks through pin extension. Also, the contact indicates a spot to which a pin is connected through extension, and includes an electrode, a contact point, and such.

As mentioned above, when pin extension up to a predetermined metal layer (that is, a repair layer) is carried out in order to connect a repair block or a spare block to another block, a conventional EDA tool removes a floated pin or considers the floated pin as an error. Meanwhile, in the present invention, an extended pin of a repair block or a spare block is connected to a custom cell such that the corresponding pin cannot be floated, and it is also possible to effectively use pin extension using an EDA tool without adding special constraints or improving the function of the EDA tool.

Figure 3A:
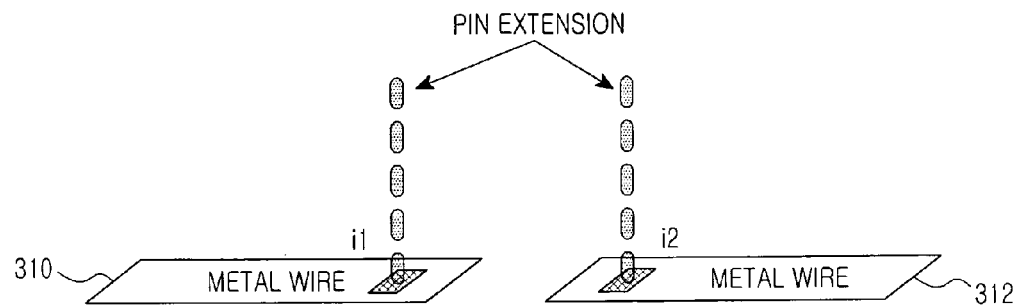
FIGS. 3A-3C illustrate a semiconductor apparatus in which pin extension is applied by using a custom cell according to an embodiment of the present invention.
Figure 3B:
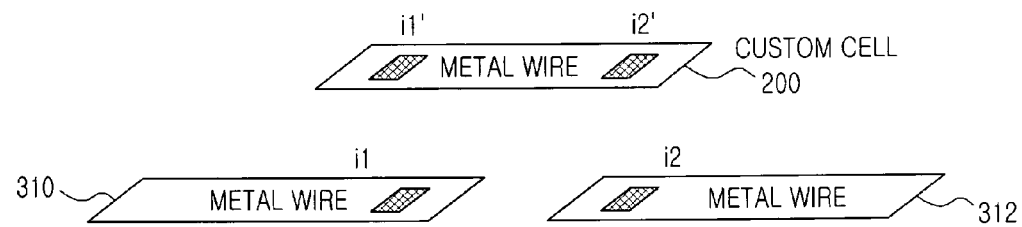
Figure 3C:
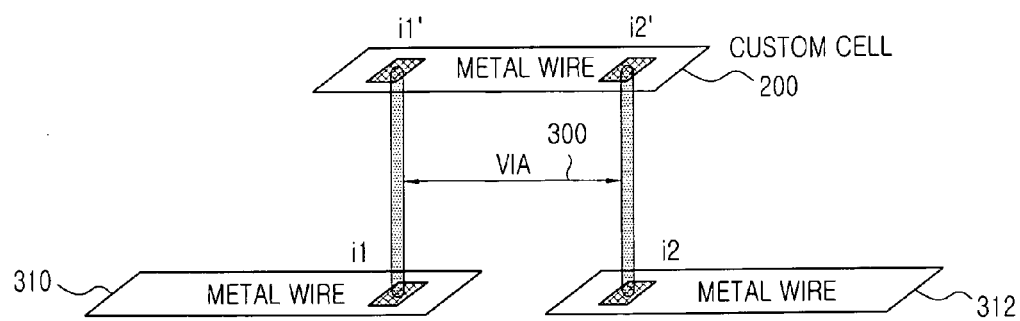

FIGS. 3A-3C illustrate a semiconductor apparatus in which pin extension is applied by using a custom cell.

FIG. 3A illustrates pin extension before disposition of a custom cell.

FIG. 3B illustrates a state in which a custom cell is disposed at a position where a pin extension is required.

When pin extension is required as shown in FIG. 3A, the custom cell 200 is disposed at a position where the pin extension is required as shown in FIG. 3B. For example, when an EDA tool is used, a designer may set the custom cell 200 to be inserted between metal wires 310 and 312 to be connected through pin extension, on a netlist, thereby disposing the custom cell at a required position.

Herein, the position where the custom cell is positioned may be a repair layer for error revision as described above. In other words, by using the custom cell, it is possible to effectively connect an input/output signal of blocks for substituting a block of a circuit that has an error, up to a repair layer, through pin extension.

FIG. 3C illustrates a via 300 automatically generated by an EDA tool.

After a designer changes a netlist of an EDA tool (in other words, a custom cell is disposed between metal wires), the EDA tool automatically adds a via in such a manner that contacts i1 and i2 of the metal wires 310 and 312 are connected to contacts i1' and i2' of the custom cell 200, respectively. The via 300 indicates the generation of pin extension by the EDA tool, and is operated as pin extension for error revision.

Accordingly, by merely inserting or removing a custom cell, or positioning to a specific metal layer of the custom cell, it is possible to effectively adjust the interconnection of cells or blocks through a pin extension (i.e. via). Also, it is possible to carry out a pin extension of a pin of a block to be repaired to a predetermined metal layer without additional work required for pin extension in a general EDA tool (e.g., work for setting additional constraints). Consequently, without the addition of an extra function for repair in a general EDA tool, a designer can revise an error by changing a netlist.

Figure 4A:
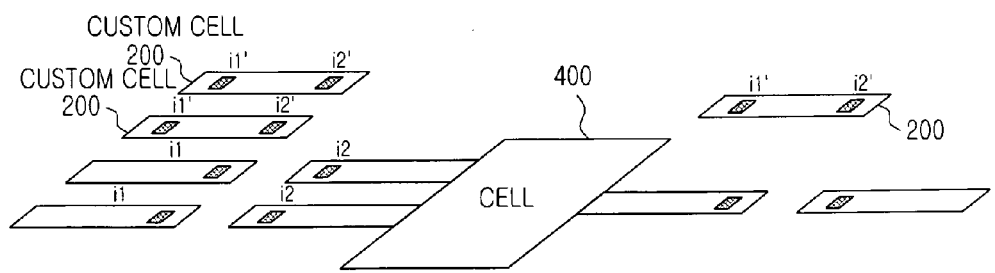
FIGS. 4A and 4B illustrate a semiconductor apparatus in which a custom cell is disposed such that pin extension is formed between metal wires requiring to be connected according to an embodiment of the present invention.
Figure 4B:
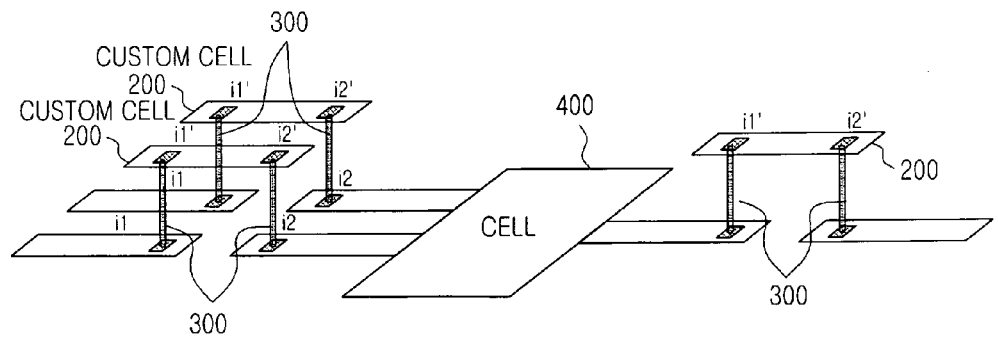

FIGS. 4A and 4B illustrate a semiconductor apparatus in which a custom cell is disposed such that pin extensions are formed between metal wires requiring to be connected.

FIG. 4A illustrates a state in which a custom cell 200 is disposed around a cell (or a block) requiring pin extension.

FIG. 4B illustrates a state in which a via 300 is formed by an EDA tool between a custom cell 200 and a metal wire connected to a cell 400 or blocks. On the custom cell 200, re-spin or re-routing is partially carried out by using the EDA tool, thereby automatically forming the via 300 (that is, pin extension). The re-spin or re-routing indicates that the P&R (Place & Route) process is performed again by using the EDA tool.

FIGS. 5A-5C illustrate an embodiment in which pin extension is applied to a portion of signal terminals (that is, pins) of a spare cell so as to support a logic function of the spare cell.

As shown, some pins of a spare cell 500 are pin-extended to a repair layer, and is appropriately connected to the repair layer during a process of repair, such that the custom cell 200 may be used for programming the logic function of a spare cell.

FIG. 5A illustrates a state in which some pins capable of being used for a logic function are extended to a plurality of custom cells 506, 508, 510, and 512, each of which has one contact, through expectation of logic function programming of the spare cell 500.

FIGS. 5B and 5C illustrates examples in which some pins of the pin-extended spare cell 500, after repair, are utilized in logic function programming.

In other words, in FIG. 5B, for the utilization of the spare cell in logic function programming, the custom cell 508 connected to a pin of the spare cell 500 is connected to the custom cell 512, and the custom cell 506 is connected to the custom cell 510. I In FIG. 5C, for the utilization of the spare cell in logic function programming, the custom cell 508 connected to a pin of the spare cell is connected to the custom cell 510, and the custom cell 506 is connected to the custom cell 512.

It is natural that the operation described above may be realized not only when a specific EDA tool equipped with a program code is used, but also directly realized in a semiconductor apparatus without a P&R process or a layout process of an EDA tool. In other words, the application of a custom cell may be used not only in design of a semiconductor apparatus using an EDA tool, but also in manufacture of a semiconductor apparatus without design of an EDA tool. Thus, revision of a block that has an error can be simplified, thereby significantly reducing a time and a cost.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A semiconductor apparatus comprising a plurality of metal layers, comprising:
   at least one repair block configured to perform a predetermined function;
   a spare block configured to substitute for the predetermined function of the repair block; and
   at least one of the plurality of metal layers predetermined as a repair layer for error revision,
   wherein at least one pin of the repair block is connected to the repair layer through a first pin extension extending at least one pin of the repair block, and at least one pin of the spare block is capable of extending to the repair layer;
   when the repair block is to be repaired, the first pin extension between the repair layer and the repair block is configured to be disconnected, and the at least one pin of the spare block is configured to be connected to the repair layer through a second pin extension, wherein a block comprises at least two cells; and
   a custom cell in the repair layer, the custom cell comprising at least one contact configured to be connected to at least one pin.

2. The semiconductor apparatus as claimed in claim 1, wherein a contact of the custom cell, positioned in the repair layer, is connected to the pin of the repair block, thereby forming the first pin extension.

3. The semiconductor apparatus as claimed in claim 1, wherein said at least one pin of the spare block is connected to one of a power supply terminal (Vdd) and a ground point (Vss).

4. The semiconductor apparatus as claimed in claim 1, wherein the repair layer is positioned at an uppermost metal layer from among the plurality of metal layers.

5. The semiconductor apparatus of claim 1, wherein when the first pin extension between the repair layer and the repair block is disconnected, the corresponding pin of the repair block is no longer connected to any of the plurality of metal layers.

6. The semiconductor apparatus of claim 1, wherein the first pin extension comprises a vertical interconnect access (via).

7. A method for designing a semiconductor apparatus comprising a plurality of metal layers, the method comprising:
   connecting at least one pin of a repair block that has a possibility of an error, to at least one repair layer predetermined for error revision, from among the plurality of metal layers, through a first pin extension;
   configuring at least one pin of a spare block capable of substituting the repair block to be extended to the repair layer;
   disconnecting the first pin extension between the repair layer and the repair block;

connecting the at least one pin of the spare block to the repair layer through a second pin extension when the repair block is to be repaired, wherein a block comprises at least two cells; and disposing a custom cell in the repair layer, the custom cell comprising at least one contact capable of being connected to at least one pin.

8. The method as claimed in claim 7, wherein the first pin extension between the repair block and the repair layer is formed by connection of a contact of the custom cell positioned in the repair layer, to the pin of the repair block.

9. The method as claimed in claim 7, wherein said at least one pin of the spare block is connected to one of a power supply terminal (Vdd) and a ground point (Vss).

10. The method as claimed in claim 7, wherein the repair layer is positioned at an uppermost metal layer from among the plurality of metal layers.

11. The method of claim 7, wherein when the first pin extension between the repair layer and the repair block is disconnected, the corresponding pin of the repair block is no longer connected to any of the plurality of metal layers.

12. The method of claim 7, wherein the first pin extension comprises a vertical interconnect access (via).

13. A semiconductor apparatus comprising:
a repair block connected to a first block and a second block of the semiconductor apparatus, the repair block configured to perform a predetermined function between the first block and the second block;
a spare block configured to substitute for the predetermined function of the repair block when the repair block is to be repaired:
a plurality of metal layers comprising a repair layer that is designated for error revision, a portion of the repair layer configured to connect the repair block to the first block and the second block, wherein a block comprises at least two cells; and wherein: the repair block comprises:
a first pin configured to connect the repair block to the portion of the repair layer through a first pin extension, and
a custom cell comprising at least one contact configured to be connected to the first pin, and
the spare block comprises:
a second pin configured to connect the spare block to the portion of the repair layer through a second pin extension when the spare block substitutes the repair block, and
a spare cell comprising at least one contact configured to be connected to the second pin.

14. The semiconductor apparatus of claim 13, further comprising:
a first vertical interconnect access (via) configured for the first pin extension; and
a second via configured for the second pin extension.

15. The semiconductor apparatus of claim 14, wherein when the repair block is to be repaired, the repair block is configured to be disconnected from the repair layer by disconnecting the first pin extension, and the spare block is configured to be connected to the repair layer through the second pin extension.

16. The semiconductor apparatus of claim 13, wherein the repair layer is positioned at an uppermost metal layer from among the plurality of metal layers.

17. The semiconductor apparatus of claim 13, further comprising:
at least one additional repair block.

* * * * *